US009146256B2

(12) United States Patent
Yasuta et al.

(10) Patent No.: US 9,146,256 B2
(45) Date of Patent: Sep. 29, 2015

(54) PROBE ASSEMBLY FOR INSPECTING POWER SEMICONDUCTOR DEVICES AND INSPECTION APPARATUS USING THE SAME, THE PROBE ASSEMBLY HAVING A PROBE BLOCK, A PROBE, AND A COOLING DEVICE

(71) Applicant: KABUSHIKI KAISHA NIHON MICRONICS, Musashino-shi (JP)

(72) Inventors: Katsuo Yasuta, Musashino (JP); Hikaru Masuta, Musashino (JP); Hideki Nei, Musashino (JP); Tatsuya Ishiwatari, Musashino (JP)

(73) Assignee: KABUSHIKI KAISHA NIHON MICRONICS, Musashino-Shi (JP)

( * ) Notice: Subject to any disclaimer, the term of this patent is extended or adjusted under 35 U.S.C. 154(b) by 241 days.

(21) Appl. No.: 13/705,571

(22) Filed: Dec. 5, 2012

(65) Prior Publication Data

US 2013/0141127 A1 Jun. 6, 2013

(30) Foreign Application Priority Data

Dec. 5, 2011 (JP) .................................. 2011-265798

(51) Int. Cl.
*G01R 31/00* (2006.01)
*G01R 1/067* (2006.01)
(Continued)

(52) U.S. Cl.
CPC ............ *G01R 1/067* (2013.01); *G01R 1/06777* (2013.01); *G01R 31/2608* (2013.01); *G01R 1/44* (2013.01)

(58) Field of Classification Search
CPC ........... G01R 31/2874; G01R 31/2862; G01R 31/2865; G01R 31/2875; G01R 31/2851; G01R 31/2889; G01R 31/2891; G01R 1/07314; G01R 31/2886; G01R 31/003; G01R 31/2642; G01R 31/2817; G01R 31/2855; G01R 31/2877; G01R 31/307; G01R 31/275; G01R 31/2831; G01R 31/2863; G01R 31/2872; G01R 31/2884; G01R 1/06711; G01R 1/07307; G01R 1/067; G01R 1/06772; G01R 31/2887; G01R 1/06705; G01R 1/06733; G01R 27/205; G01R 31/2601; G01R 31/2856; H01L 21/67248; H01L 21/67098; H01L 33/64; H01L 23/34; Y10S 269/903; Y10S 134/902; Y10S 136/293; Y10S 438/909; H05B 37/02; H05B 2214/02; H05B 3/84; H05B 6/62; G06F 1/20; G06F 1/206; F28D 15/00; F28D 2021/0077; G05B 23/02; G05D 7/0647; G05D 7/0676; G01N 2035/1037
See application file for complete search history.

(56) References Cited

U.S. PATENT DOCUMENTS 4,820,976 A  *  4/1989 Brown ..................... 324/750.08
5,378,971 A        1/1995 Yamashita
(Continued)

FOREIGN PATENT DOCUMENTS

CN    101629971 A    1/2010
JP    06-180327 A    6/1994
(Continued)

*Primary Examiner* — Vinh Nguyen
(74) *Attorney, Agent, or Firm* — Browdy and Neimark, PLLC

(57) ABSTRACT

A probe assembly for inspecting power semiconductor devices, which includes a probe block having more than one probe holding hole, more than one probe, each of which is contained in one of the probe holding holes with its outer surface being in contact with the inner surface of the probe holding hole, and which has lower end protruding from the probe block and coming into contact with the power semiconductor device on inspection, and one or more cooling units which cool the probe block. According to the probe assembly and the inspection apparatus, it is possible to inspect characteristics of power semiconductor devices accurately by suppressing temperature rises of the probes as well as the power semiconductor device under test.

9 Claims, 10 Drawing Sheets

(51) Int. Cl.
*G01R 31/26* (2014.01)
*G01R 1/44* (2006.01)

(56) References Cited

U.S. PATENT DOCUMENTS

| | | | | |
|---|---|---|---|---|
| 6,043,671 | A * | 3/2000 | Mizuta | 324/750.08 |
| 6,191,599 | B1 * | 2/2001 | Stevens | 324/750.07 |
| 6,450,803 | B2 * | 9/2002 | Shirakawa et al. | 432/77 |
| 6,975,126 | B2 | 12/2005 | Haseyama | |
| 2004/0070961 | A1 | 4/2004 | Haseyama | |
| 2007/0001692 | A1 | 1/2007 | Yamada | |
| 2007/0229103 | A1 * | 10/2007 | Tani | 324/755 |
| 2010/0289515 | A1 * | 11/2010 | Kiriki | 324/760 |

FOREIGN PATENT DOCUMENTS

| | | |
|---|---|---|
| JP | 2007-012475 A | 1/2007 |
| JP | 2007273233 A | 10/2007 |
| KR | 100702021 B1 | 4/2007 |

* cited by examiner

PROBE ASSEMBLY FOR INSPECTING POWER SEMICONDUCTOR DEVICES AND INSPECTION APPARATUS USING THE SAME, THE PROBE ASSEMBLY HAVING A PROBE BLOCK, A PROBE, AND A COOLING DEVICE

BACKGROUND OF THE INVENTION

1. Field of the Invention

The present invention relates to a probe assembly for inspecting power semiconductor devices and an inspection apparatus for power semiconductor devices using the probe assembly.

2. Description of the Related Art

For inspecting electric characteristics of power semiconductor devices, such as power transistor and IGBT (Insulated Gate Bipolar Transistor), it is preferable as a matter of course to apply large electric current at a level of several hundreds amperes to the device under test adapting to its actual operating conditions. However, when a large electric current is applied through inspection probes to a power semiconductor device in wafer state or in chip state after dicing, the semiconductor device and/or the inspection probes generate heat because of internal resistance of the semiconductor device and contact resistance found at the contact points of electrodes of the semiconductor device and the probes. The heat thus generated tends to invite temperature drift which disturbs accurate measurements, and damage the semiconductor device and/or inspection probes in some cases.

In view of the circumstances as above mentioned, power semiconductor devices are, in general, roughly selected in wafer state or in chip state by inspecting their characteristics applying relatively small electric current to them, and then finally inspected in the final process after having been assembled in a package. However, characteristic faults are frequently found in a final full-spec inspection on some of the power semiconductor devices which passed characteristics inspections conducted by applying small electric current. In that case, various processes carried out after the rough selection become useless, which invites disadvantages such as products cost rising and waste volume increasing.

On the other hand, as to probe cards, many types of probe cards equipping a cooling means have been proposed. The Japanese Patent Kokai Hei 2-192749 (JP1990/192749 A1), for example, discloses a probe card which has a cooling pipe inside of the probe card to flow an appropriate cooling medium. The cooling means, however, is equipped in the probe card not to prevent probes or a semiconductor device from being heated by large electric current applied to the semiconductor device through the probes, but to prevent the probe card from melting or deforming by the heat radiated from a semiconductor device which is heated at high temperature for inspection.

The Japanese Patent Kokai No. 2000-28641 (JP2000/28641 A1) discloses a probe card, which supplies cooling air to a cooling chamber to cool the base part of probe needles contained in the cooling chamber, thereby preventing the heat transfer from a semiconductor device heated at high temperature for inspection to the probe card. In this probe card, however, what is in question is not the heat generated in the semiconductor device or in the proves by large electric current applied to the semiconductor device for inspection through the probes, but the heat transferring from the semiconductor device under test to the probe card. In addition, the probe card has disadvantages that the cooling effect is not sufficient because the base part of the probe needles are cooled just by cooling air which come into contact with the outer surface of the base part.

Further, the Japanese Patent Kokai No. 2007-121245 (JP2007/121245 A1) discloses a probe card, which has Peltier elements attached to the side wall of a ceramic board which composes the probe card, and leading wires branched from a part of the probe wires which are connected to the side wall of the ceramic board. The probes are cooled through the leading wires. The probe card, however, has disadvantages that the cooling effect may not be sufficient because the probes are cooled indirectly through the leading wires. Furthermore, since the probe card needs the leading wires to cool the probes, the structure of the probe card is complicated and a lot of works is needed to produce the probe card.

The present invention was made in view of the conventional technical situation as above mentioned. An aim of the present invention is to provide a probe assembly for power semiconductor devices, which makes it possible to realize accurate measurements by effectively preventing temperature rising caused by electric current supplied to the probes and the semiconductor device in a large current inspection of power semiconductor devices. Another aim of the present invention is to provide an inspection apparatus for power semiconductor devices, which uses the probe assembly for power semiconductor devices.

SUMMARY OF THE INVENTION

After having diligently studied to attain the aims, the present inventors have found that probes can be cooled effectively and simply when a probe block having probe holding holes to hold more than one probe is prepared instead of a probe card and the probe block is utilized as a heat sink to cool the probes. The present inventors have further found that both of the probes and a power semiconductor device are cooled effectively when a cooling medium is jetted out toward the probe block and the power semiconductor device under test, and accomplished the present invention.

The present invention attains the above mentioned aims by providing a probe assembly for power semiconductor devices and an inspection apparatus using the same. The probe assembly for power semiconductor devices of the present invention comprises;

(1) a probe block having more than one probe holding hole, (2) more than one probe, each of which is contained in one of the probe holding holes with its outer surface being in contact with the inner surface of the probe holding hole, and which has lower end protruding from the probe block and coming into contact with the power semiconductor device on inspection, and (3) one or more cooling means which cool the probe block.

The probe assembly of the present invention cools the probes through the probe block, in which more than one probe is contained with its outer surface being in contact with the inner surface of the probe holding hole. Accordingly, the probe block functions as a heat sink and the probes are cooled more effectively as compared with the case that a cooling medium is blown toward the probes directly. In view of this, the probe block of the probe assembly of the present invention is preferably made of a material having high thermal conductivity, and is more preferably made of a material having high electric conductivity in addition to high thermal conductivity. When the probe block is made of a material having high electric conductivity in addition to high thermal conductivity, it is possible not only to cool the probes effectively through the probe block, but also to supply large electric current to the probes, in particular to the force probes, through the probe block. Metals, such as copper, aluminum and silver, for example, can be raised as a material having both high thermal conductivity and high electric conductivity.

Any types of cooling means can be used. For example, a blower which blows cooling gas towards the probe block to cool it, cooling chambers formed inside and/or outside of the probe block and a cooling medium supply system which supplies cooling medium into the cooling chambers, or Peltier elements which cool the probe block can be used as a cooling means. Only one type of the cooling means may be used alone, or more than one type of the cooling means may be used in combination.

In a preferable embodiment, the probe block has cooling fins in appropriate form to raise heat exchange efficiency between the probe block and cooling gas. Instead of the cooling fins, the probes contained in the probe block may protrude their upper ends from the probe block to utilize the upper ends as cooling fins.

A power semiconductor device can be cooled by the cooling gas or the cooling medium which have been used to cool the probe block. For example, in order to cool a power semiconductor device with the cooling gas having been used to cool the probe block, the cooling gas should be blown toward the probe block from above so that the cooling gas, after having exchanged the heat with the probe block, comes into contact with the power semiconductor device located under the probe block.

On the other hand, in order to cool a power semiconductor device with the cooling medium having been used to cool the probe block, the cooling chamber into which the cooling medium is supplied should have cooling medium exits which open in the direction of the lower ends of the probes protruding from the probe block, namely, in the direction of the power semiconductor device under test so that the cooling medium supplied into the cooling chamber, after having exchanged the heat with the probe block, jets out from the cooling medium exits to come into contact with the power semiconductor device located below. In this case, a gas is preferably used as a cooling medium not to hinder the inspection of the power semiconductor device.

In a preferable embodiment, the probe assembly of the present invention equips a temperature sensor which measures the temperature of the probe block, thereby the temperature of the probe block is constantly monitored to know the temperature of the probes which are thermally contact with the probe block. Further, in another preferable embodiment, the probe assembly of the present invention has a control unit which regulates the action of a cooling means based on the output signals from the temperature sensor to control the temperature of the probe block. Therefore, according to the probe assembly of the present invention, it is possible to conduct characteristics inspection of a power semiconductor devices always at the most appropriate temperature.

According to the probe assembly of the present invention, the temperature rises of the probes and a power semiconductor device under test are suppressed even when a larger electric current is applied to the power semiconductor device through the probes, thereby accurate measurements free from temperature drift are realized and it has become possible to conduct characteristics inspection of a power semiconductor device, in a wafer state or in a chip state after dicing, under the conditions close to its actual performance. Further, according to the inspection apparatus for inspecting power semiconductor devices having the probe assembly of the present invention, characteristics inspection of a power semiconductor device, in a wafer state or in a chip state after dicing, can be conducted under the conditions in accordance with its actual performance. Therefore, according to the inspection apparatus for inspecting power semiconductor devices of the present invention, it is possible to remarkably decrease the frequency of the cases that characteristics failures are found in a final inspection conducted after package process and thereby well suppress the rise of the product cost and the increase of the waste volume, which are advantages.

DESCRIPTION OF THE PREFERRED EMBODIMENTS

Hereinafter, the present invention is explained in detail with reference to the accompanying drawings picking up IGBT as an example of power semiconductor devices, which are the targets of the probe assembly and the inspection apparatus of the present invention. As a matter of course, the power semiconductor devices targeted by the present invention are not limited to IGBT, and the present invention is not limited to the illustrated examples.

Figure 1:
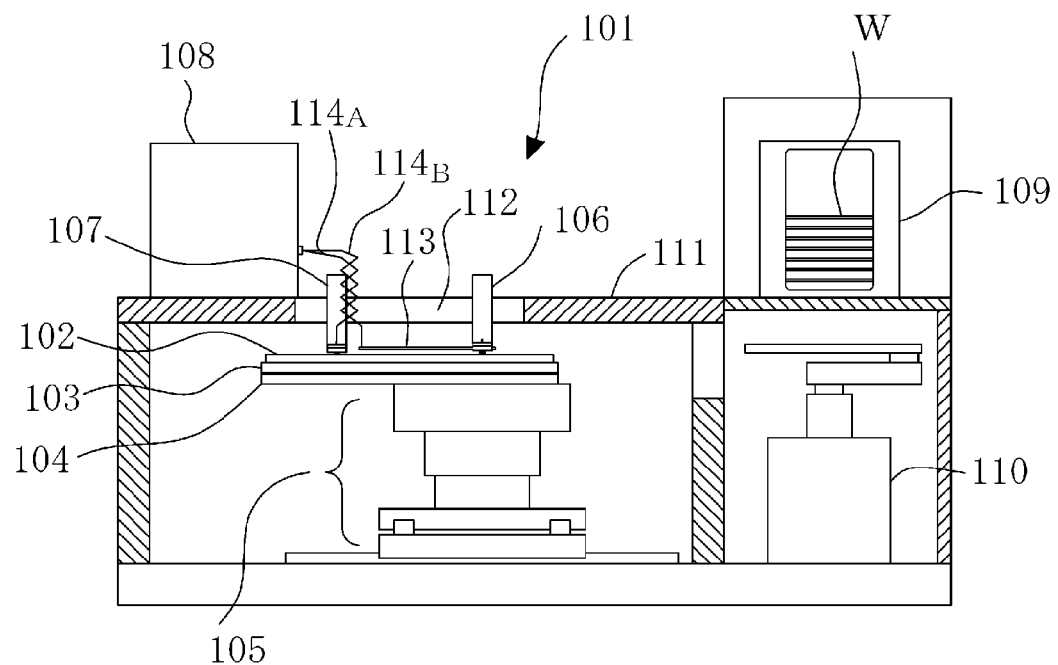
FIG. 1 is a partial cross section of a front view showing an example of an inspection apparatus having a probe assembly for power semiconductor devices of the present invention.
Figure 2:
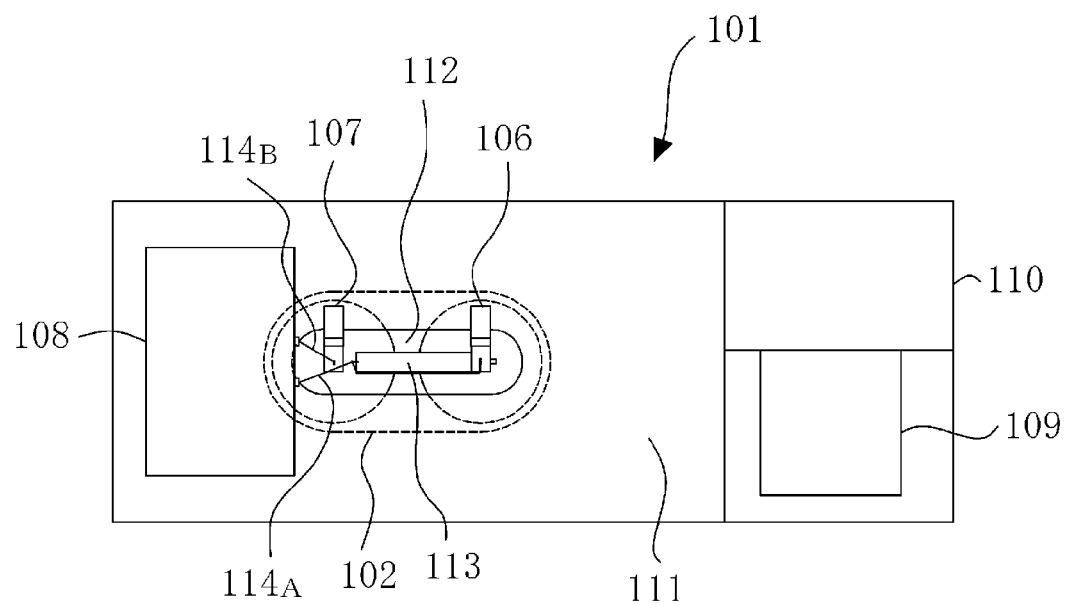
FIG. 2 is a plane view showing an inspection apparatus having a probe assembly for power semiconductor devices of the present invention.

FIG. 1 is a partial cross section of a front view showing an example of an inspection apparatus for power semiconductor devices having a probe assembly according to the present invention. FIG. 2 is a plane view of the inspection apparatus as shown in FIG. 1. In FIG. 1 and FIG. 2, the reference numeral 101 indicates the inspection apparatus for power semiconductor devices, the reference numeral 102 indicates a chuck stage, the reference numeral 103 indicates an electric insulating plate on which the chuck stage 102 is placed and held, and the reference numeral 104 indicates a thermal insulating plate. A heater, which is explained later, is inserted between the electric insulating plate 103 and the thermal insulating plate 104. The reference numeral 105 indicates XYZ-θ stage, which moves the chuck stage 102 in X, Y, Z and θ directions together with the electric insulating plate 103 and the thermal insulating plate 104. The reference numeral 106 indicates a manipulator which holds probe assembly for front side electrodes. The reference numeral 107 indicates a manipulator which holds probe assembly for back side electrodes, and the reference numeral 108 indicates a tester. The probe assembly for front side electrodes and the probe assembly for back side electrodes are able to be moved in X, Y and Z directions in narrow range by the manipulator 106 and the manipulator 107, respectively.

The reference symbol W indicates a wafer to be inspected. The reference numeral 109 indicates a wafer cassette which stores wafers W, and the reference numeral 110 indicates a wafer handling equipment, which takes out a wafer W from the wafer cassette 109 to place it on a below mentioned wafer holding area of the chuck stage 102, and takes away a wafer W, for which inspection has been finished, from the wafer holding area to outside. There are no limitations on a mechanism which makes it possible for the wafer handling equipment 110 to convey a wafer W as long as the wafer handling equipment 110 can convey a wafer W. A wafer handling equipment utilizing Bernoulli system, for example, is preferably employed.

The reference numeral 111 indicates an upper base plate of the inspection apparatus 101. The upper base plate 111 has an elliptic hole 112. The manipulator 106 and the manipulator 107 are fixed on the fringe of the elliptic hole 112 of the upper base plate 111. Each of the manipulator 106 and the manipulator 107 has a cantilever arm and a holding component attached to the tip of the cantilever arm and protrudes downward through the elliptic hole 112. With the cantilever arms and the holding components, the manipulator 106 and the manipulator 107 hold the probe assembly for front side electrodes and the probe assembly for back side electrodes, respectively, at a position below the upper base plate 111. The probe assembly for front side electrodes and the probe assembly for back side electrodes are explained later. The reference numeral 113 indicates a conductive component for force line, and $114_A$ and $114_B$ are conductive cables. The probe assembly for front side electrodes is connected to the tester 108 via the conductive component for force line 113 and the conductive cable $114_A$, and the probe assembly for back side electrodes is connected to the tester 108 via the conductive cable $114_B$. The inspection apparatus 101 has a microscope and/or an imaging apparatus for alignment, which are not illustrated, in addition to the components mentioned above.

Figure 3:
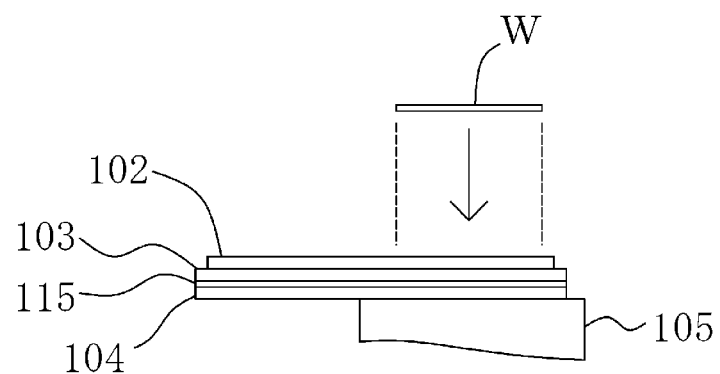
FIG. 3 is an enlarged front view showing only the chuck stage and its neighboring part of the inspection apparatus.

FIG. 3 is an enlarged front view showing only the chuck stage 102 and its neighboring part of the inspection apparatus 101. In FIG. 3, the reference numeral 115 is a heater inserted between the electric insulating plate 103 and the thermal insulating plate 104. When electric power is supplied from not illustrated power source, the heater 115 heats the chuck stage 102 together with a wafer W placed on the wafer holding area of the chuck stage 102. A temperature sensor, not illustrated, is attached to the wafer holding area. The chuck stage 102 and the wafer W placed on the wafer holding area can be heated at a prescribed temperature by controlling electric power supplied to the heater 115 based on a signal from the temperature sensor.

Figure 4:
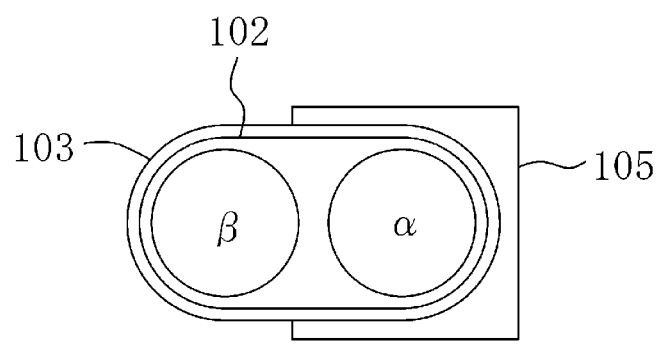
FIG. 4 is a plane view of FIG. 3.

FIG. 4 is a plane view of FIG. 3. As shown in FIG. 4, the wafer holding area indicated by the symbol α and a probe contact area indicated by the symbol β are formed on the upper surface of the chuck stage 102 close to each other but without overlapping of the areas. The wafer holding area α has an appropriate vacuum mechanism, such as suction grooves connected to a vacuum source, not illustrated. By the vacuum mechanism, the wafer holding area α sucks and holds a wafer W with the upper surface of the area being in contact with the back side of the wafer W.

There are no limitations on the size of the wafer holding area α as long as the wafer holding area α is able to hold the largest wafer W expected to be inspected by the inspection apparatus 101. Since a wafer W to be inspected usually has a circular shape, the wafer holding area α is usually formed to have circular shape in accordance with the shape of a wafer W. However, the shape of the wafer holding area α is not limited to circle. The wafer holding area α can be formed in ellipse, oval, or polygon as long as it can hold a wafer W.

In the inspection apparatus 101 of the present example, the chuck stage 102 is made of a conductive material, such as copper, received anti-rust plating treatment. As a part of the upper surface of the chuck stage 102 forms the wafer holding area α, the upper surface of the wafer holding area α is also conductive. When a wafer W is placed on the wafer holding area α, the conductive upper surface of the wafer holding area α is in contact with the back side of the wafer W. The part of the wafer holding area α which comes into contact with the back side of the wafer W is called as conductive contact parts.

On the other hand, the probe contact area β, which is an area where the probes for back side electrodes come into contact with, is formed on the upper surface of the chuck stage 102 next to the wafer holding area α. Accordingly, a part of the upper surface of the chuck stage 102 forms the probe contact area β. The probes for back side electrodes will be explained later. Since the chuck stage 102 in this example is made of a conductive material, such as copper, received anti-rust plating treatment as mentioned above, the probe contact area β is conductive and electrically continues to said conductive contact parts of the wafer holding area α through the wafer holding area α and the part of the chuck stage 102 other than the probe contact area β.

The size of the probe contact area β is set to cover the area having the same size and the same shape as the largest wafer W which is expected to be held on the wafer holding area α. In this example, it is supposed that a wafer W which is expected to be held on the wafer holding area α is in a circular shape having a diameter same as that of the wafer holding area α at largest. Therefore, the probe contact area β in this example is a circular area having the same radius as the wafer holding area α. However, the shape of the probe contact area β is not limited to circle. The probe contact area β can be formed in any shape, for example, in ellipse, oval, or polygon as long as it covers the area having the same size and the same shape as the largest wafer W to be inspected. The probe contact area β may be same in size and shape as the largest wafer W which is expected to be held on the wafer holding area α, because it is sufficient that the probe contact area β covers the area having the same size and the same shape as the largest wafer W which is expected to be held on the wafer holding area α. It is preferable, however, that the size and the shape of the probe contact area β are set to cover an area larger than the largest wafer W held on the wafer holding area α for the sake of prudence.

As explained above, the conductive upper surface of the chuck stage 102 itself composes both of the wafer holding area α and the probe contact area β in this example. However, a conductive sheet which covers the area having the same size and the same shape as the largest wafer W held on the wafer holding area α may be placed on the upper surface of the chuck stage 102 to utilize the upper surface of the conductive sheet as the probe contact area β. In the case that the conductive sheet is utilized as the probe contact area β, it is possible to exchange the conductive sheet only when the probe contact area β is damaged by repeated contacts with the probes for the back side electrodes, which reduces time and cost needed for maintenance.

As shown in FIG. 4, the chuck stage 102 exists on the XYZ-θ stage 105, and the wafer holding area α and the probe contact area β are formed on the chuck stage 102. Therefore, the wafer holding area α and the probe contact area β move together in the same direction when the XYZ-θ stage 105 is operated to move the chuck stage 102.

Figure 5:
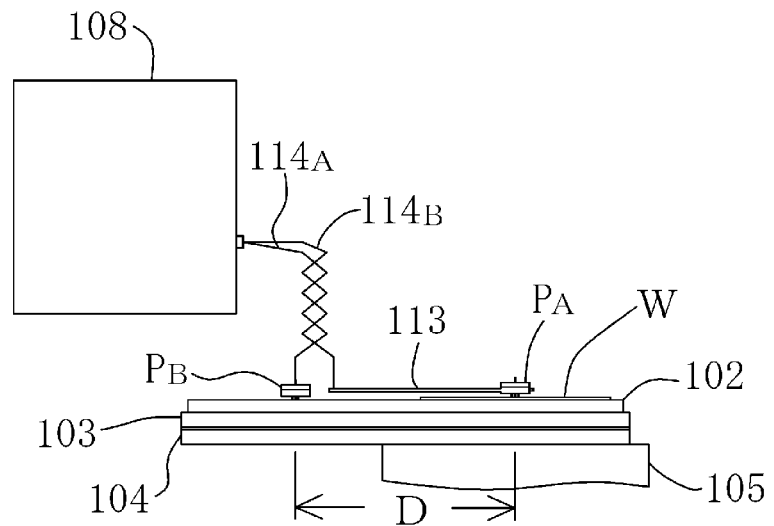
FIG. 5 is a front view showing the relationship between the chuck stage and the probe assemblies for front and back side electrodes.
Figure 6:
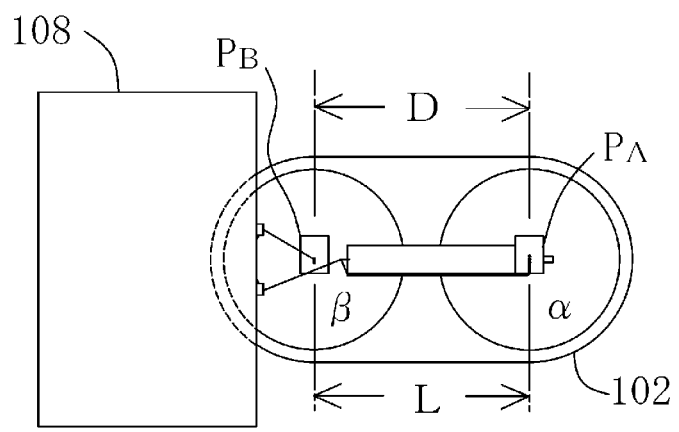
FIG. 6 is a plane view of FIG. 5.

FIG. 5 is a front view showing the relationship between the chuck stage 102 and the probe assemblies for front and back side electrodes. FIG. 6 is a plane view of FIG. 5. Only the components necessary to explain the relationship are shown in FIG. 5 and FIG. 6 for the sake of convenience. In FIG. 5 and FIG. 6, $P_A$ indicates the probe assembly for front side electrodes and $P_B$ indicates the probe assembly for back side electrodes. W is a wafer held on the wafer holding area α. The probe assembly for front side electrodes $P_A$ and the probe assembly for back side electrodes $P_B$ comprise more than one force probe and more than one sense probe, both not illustrated. While only one force probe is sufficient, it is preferable that there are more than one force probe, because it is necessary to apply large current when a power semiconductor device is inspected. Similarly, while only one sense probe is sufficient, it is preferable that there are more than one sense probe, because continuity check becomes possible when there are more than one sense probe. While depending on the types of the semiconductor devices to be inspected, the probe assembly for front side electrodes $P_A$ usually has a gate probe or a base probe, not illustrated, in addition to the force probes and the sense probes.

The probe assembly for front side electrodes $P_A$ and the probe assembly for back side electrodes $P_B$ are located leaving a distance D in horizontal direction between them. The distance D is set so that the probe assembly for front side electrodes $P_A$ comes into contact with a wafer W held on the wafer holding area α and the probe assembly for back side electrodes $P_B$ comes into contact with the probe contact area β, when the chuck stage 102 is moved upward by the XYZ-θ stage 105. The conductive component for force line 113 is placed parallel to the upper surface of the chuck stage 102 and along the straight line connecting the probe assembly for front side electrodes $P_A$ and the probe assembly for back side electrodes $P_B$. In this example, the conductive component for force line 113 is a rigid and conductive component in a plate form. The one end of the conductive component for force line 113 nearer to the probe assembly for front side electrodes $P_A$ is electrically connected to the more than one force probe comprised in the probe assembly for front side electrodes $P_A$ and the other end of the conductive component for force line 113 is connected to the tester 108 via the conductive cable $114_A$. The probe assembly for back side electrodes $P_B$ is connected to the tester 108 through the conductive cable $114_B$.

The symbol L in FIG. 6 represents the distance between the center of the wafer holding area α and the center of the probe contact area β. In this example, the distance D is set to be same or almost same as the distance L. Since the distance D is set to be same or almost same as the distance L and the probe contact area β covers the area having the same size and the same shape as the largest wafer W held on the wafer holding area α, the probe assembly for back side electrodes $P_B$ relatively moves within the probe contact area β when the probe assembly for front side electrode $P_A$ relatively moves within the wafer W to be inspected held on the wafer holding area α together with the movement of the chuck stage 102 by the XYZ-θ stage 105.

Figure 7:
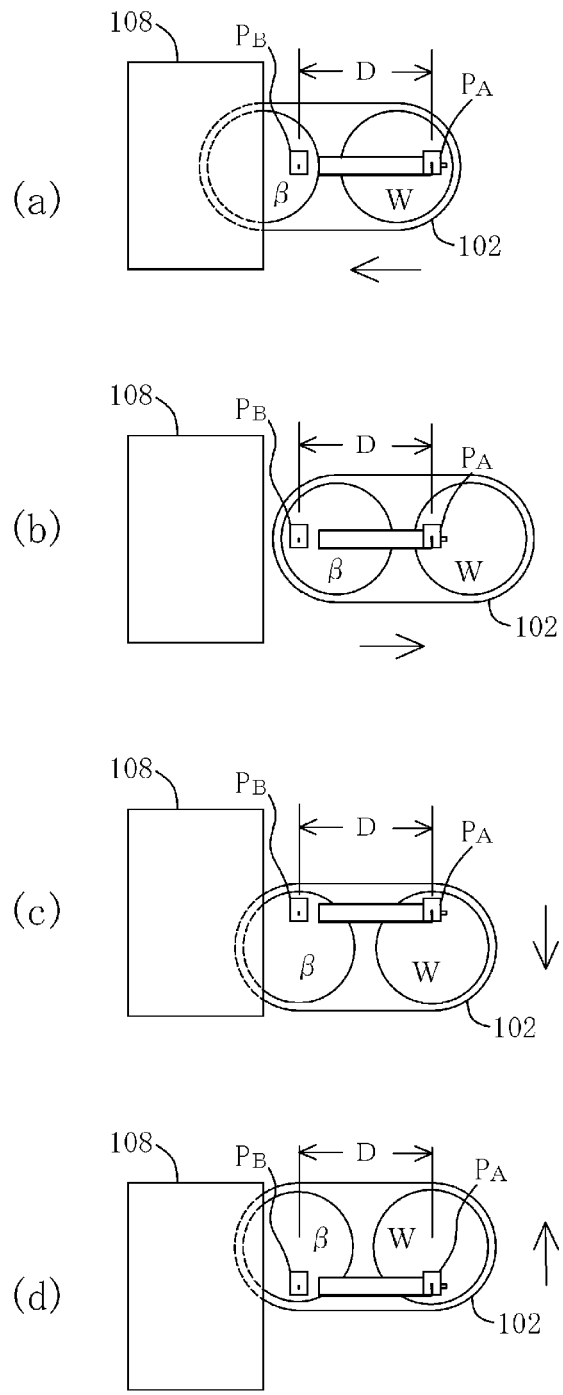
FIG. 7 is a plane view showing the movement of the probe assembly for front side electrodes and the probe assembly for back side electrodes.

FIG. 7 is a plane view showing the movement of the probe assembly for front side electrodes $P_A$ and the probe assembly for back side electrodes $P_B$. In FIG. 7, as the largest wafer held on the wafer holding area α, a circular wafer W having the same radius as the wafer holding area α is placed and held on the wafer holding area α. As shown in (a) to (d) of FIG. 7, when the chuck stage 102 moves left, right, down or up in the figures, the probe assembly for front side electrodes $P_A$ relatively moves within the wafer W held on the wafer holding area α. Corresponding to the movement of the probe assembly for front side electrodes $P_A$, the probe assembly for back side electrodes $P_B$ relatively moves within the probe contact area β keeping the distance D from the probe assembly for front side electrodes $P_A$.

As explained above, according to the inspection apparatus 101, even in the case that the chuck stage 102 is moved by the XYZ-θ stage 105 to inspect many semiconductor devices formed on a wafer W one by one, the probe assembly for back side electrodes $P_B$ comes into contact with the probe contact area β which electrically continues to the back side electrodes of a semiconductor device under inspection, whenever the probe assembly for front side electrodes $P_A$ comes into contact with the front side electrodes of the semiconductor device under inspection, thereby supplying necessary electric signals to the semiconductor device. Therefore, according to the inspection apparatus 101, it is possible to inspect electrical characteristics of semiconductor devices in wafer state. In addition, the positional relationship between the tester 108 and the probe assembly for front side electrodes $P_A$ as well as the positional relationship between the tester 108 and the probe assembly for back side electrodes $P_B$ are kept constant, because it is not necessary to move the probe assembly for front side electrodes $P_A$ and the probe assembly for back side electrode $P_B$ even in the case that many semiconductor devices on a wafer W are inspected one by one. Therefore, according to the inspection apparatus 101, the lengths of the electric connection lines which connect the tester 108 to the probe assembly for front side electrodes $P_A$ and the probe assembly for back side electrodes $P_B$ can be always kept shortest and constant, even in the case that many semiconductor devices on a wafer W are inspected one by one in wafer state. Accordingly, it is possible to obtain the transient characteristics necessary to conduct large current test close to the actual performance of the semiconductor device under test and dynamic characteristics test by minimizing parasitic inductance of measuring lines, which are advantageous effects.

Figure 8:
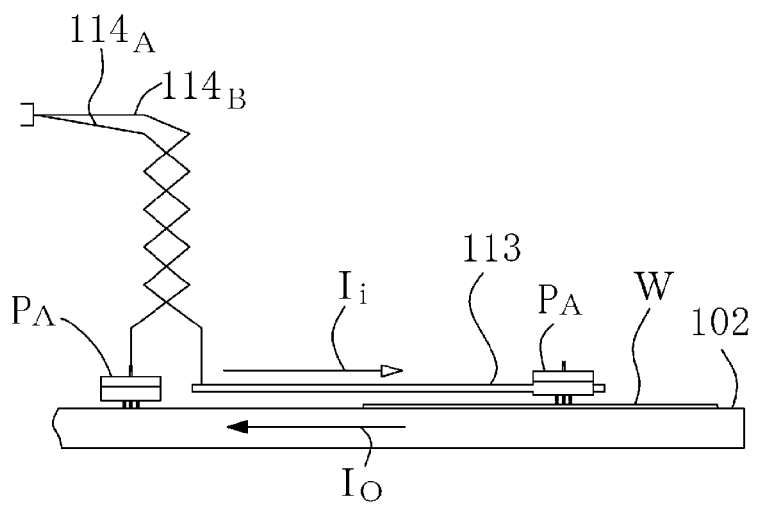
FIG. 8 is a schematic drawing showing electric currents which flow in the conductive component for force line and the chuck stage.
Figure 9:
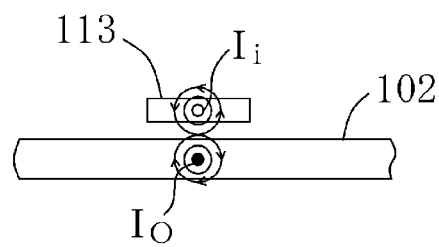
FIG. 9 is a schematic drawing showing the magnetic fields produced.

FIG. 8 is a schematic drawing showing electric currents which flow in the conductive component for force line 113 and the chuck stage 102. FIG. 9 is a schematic drawing showing the magnetic fields produced by the electric currents.

On inspection, an electric circuit is formed, which starts the tester 108 and goes back to the tester 108 through the conductive cable 114$_A$, the conductive component for force line 113, force probes in the probe assembly for front side electrodes P$_A$, a semiconductor device on a wafer W, the conductive contact parts of the wafer holding area α, the chuck stage 102, the probe contact area β, the probe assembly for back side electrodes P$_B$ and the conductive cable 114$_E$ in this order. The electric current Ii shown in the figure flows in the conductive component for force line 113, and the electric current Io shown in the figure flows in the chuck stage 102. Since the conductive component for force line 113 is placed parallel to the upper surface of the chuck stage 102 along the straight line connecting the probe assembly for front side electrodes P$_A$ and the probe assembly for back side electrodes P$_B$, the direction of the magnetic field produced by the electric current Ii is opposite to the direction of the magnetic field produced by the electric current Io as shown in FIG. 9, and the two magnetic fields are cancelled each other. Due to this, the effective inductance of the electric current path between the probe assembly for front side electrodes P$_A$ and the probe assembly for back side electrodes P$_B$ can be reduced, and measurements with high accuracy and better transient characteristics are realized.

The conductive component for force line 113 is not limited to a rigid and conductive component in plate form as long as it can be placed parallel to the upper surface of the chuck stage 102 along the straight line connecting the probe assembly for front side electrodes P$_A$ and the probe assembly for backside electrodes P$_B$. The conductive component for force line 113 may be a liner component with circular cross section. However, as the chuck stage 102 in which electric current Ii flows is in plate form, the conductive component for force line 113 is preferably in plate form having the width larger than the gap between the conductive component for force line 113 and the chuck stage 102 in order to form parallel coupling structure with the chuck stage 102 holding air as dielectric material between them.

Figure 10:
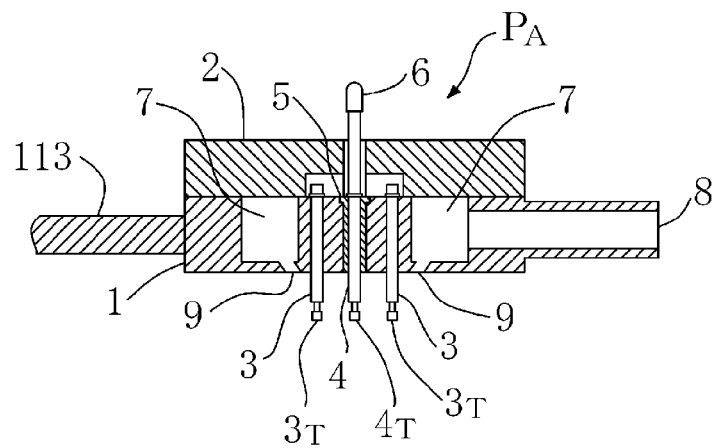
FIG. 10 is an enlarged partial cross section showing an example of the probe assembly of the present invention.
Figure 11:
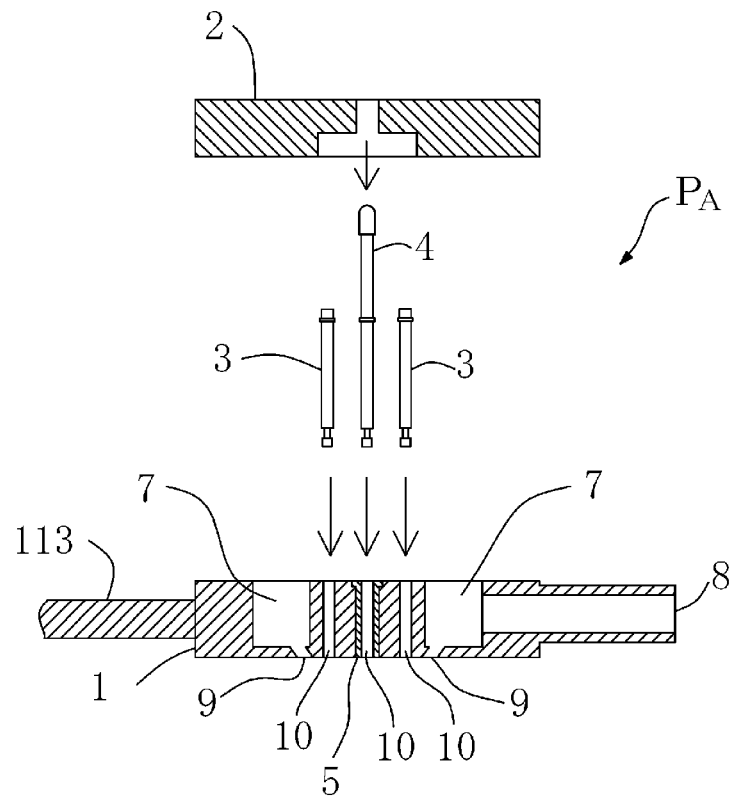
FIG. 11 is an exploded view of the probe assembly as shown in FIG. 10.

FIG. 10 is an enlarged partial cross section showing the probe assembly for front side electrodes P$_A$, which is an example of the probe assembly of the present invention. FIG. 11 is an exploded view of the probe assembly for front side electrodes P$_A$ as shown in FIG. 10. In FIG. 10 and FIG. 11, the reference numeral 1 indicates a probe block and the reference numeral 2 indicates a block cover. The probe block 1 is made of a material which has high electrical conductivity as well as high thermal conductivity, and is electrically connected to the conductive component for force line 113 by being joined to the conductive component for force line 113. The reference numeral 3 indicates a force probe. The force probes 3 are attached to the probe block 1 by being inserted and fixed in probe holding holes 10 formed in the probe block 1. Each of the outer surfaces of the force probes 3 is in contact with the inner surface of the corresponding probe holding hole 10. Therefore, the force probes 3 electrically continue to the probe block 1 and the conductive component for force line 113.

On the other hand, the reference numeral 4 indicates a sense probe. The sense probes 4 are attached to the probe block 1 by being inserted and fixed in the probe holding holes 10 formed in the probe block 1. The sense probes 4, however, are electrically insulated from the probe block 1 and the conductive component for force line 113, because an electrical insulating material 5 exists between each of the outer surfaces of the sense probes 4 and the inner surface of the corresponding probe holding hole 10.

The end parts 3$_T$ of the force probes 3 and the end parts 4$_T$ of the sense probes 4 are pressed downward by an elastic means, not illustrated, which contained in the force probes 3 and the sense probes 4, respectively. When any external force is applied upward, the end parts 3$_T$ and the end parts 4$_T$ are able to move upward according to the strength of the external force. The reference numeral 6 indicates a conductive cable which connects the sense probes 4 and the tester 108.

The reference numeral 7 indicates a cooling chamber formed in the probe block 1, the reference numeral 8 indicates a cooling medium entrance and the reference numeral 9 indicates a cooling medium exit. The cooling medium entrance 8 is connected to an appropriate cooling medium supply system, not illustrated. The cooling medium supplied into the cooling chamber 7 from the cooling medium supply system via the cooing medium entrance 8 cools the force probes 3, the sense probes 4 and further the gate probe, which mentioned below, through the probe block 1. The cooling medium goes out from the cooling medium exits 9 to come into contact with a semiconductor device under test which is located under the probe assembly for front side electrodes P$_A$ and cool it.

As explained above, the probe assembly for front side electrodes P$_A$ in this example has the cooling means for cooling the probes and the semiconductor device under test. Therefore, according to the probe assembly for front side electrodes P$_A$ in this example, excessive temperature rises of the probes and the semiconductor device under test are well prevented even when a large electric current is supplied to the semiconductor device for inspection. Due to this, more stable and more accurate inspection is realized. While air is used as cooling medium generally, the cooling medium is not limited to air as a matter of course. Appropriate gases other than air, such as nitrogen gas, or appropriate liquids, such as water, can be of course used as the cooling medium. It is preferable, however, to use gas such as air as the cooling medium when the cooling chamber 7 has the cooling medium exits 9 which open toward the end parts of the force probes 3 and the sense probes 4 all protruding from the probe block 1, and when the cooling medium goes out from the cooling medium exits 9 to come into contact with the semiconductor device located below.

Figure 12:
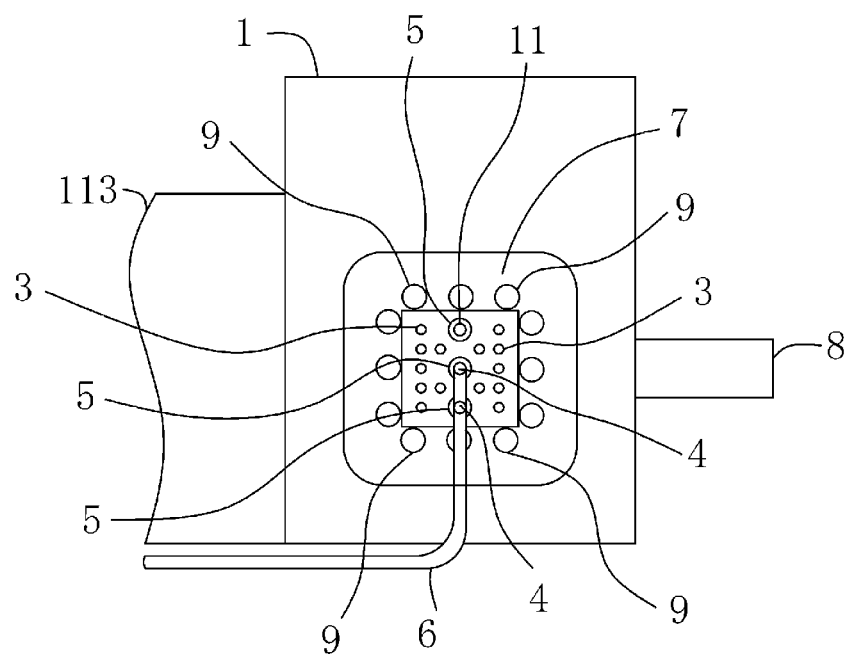
FIG. 12 is a plane view showing the probe assembly without block cover.

FIG. 12 is an enlarged plane view showing the probe assembly for front side electrodes P$_A$ without the block cover 2. In FIG. 12, the reference numeral 11 indicates the gate probe. An electrically insulating material 5 is inserted between the gate probe 11 and the probe holding hole 10 formed in the probe block 1. The gate probe 11 is therefore electrically insulated from the conductive component for force line 113 as well as the probe block 1.

As shown in FIG. 12, each of the probes is located at a lattice point of a lattice pattern. Fourteen (14) force probes 3 in total are located at the lattice points of the lattice pattern respectively, except the lattice points neighboring two sense probes 4 and one gate probe 11. The arrangement and the number of the various probes as shown in FIG. 12 are just one example. It is a matter of course that the arrangement and the number of the force probes 3, sense probes 4, and gate probe 11 are not limited to those as shown in FIG. 12.

Figure 13:
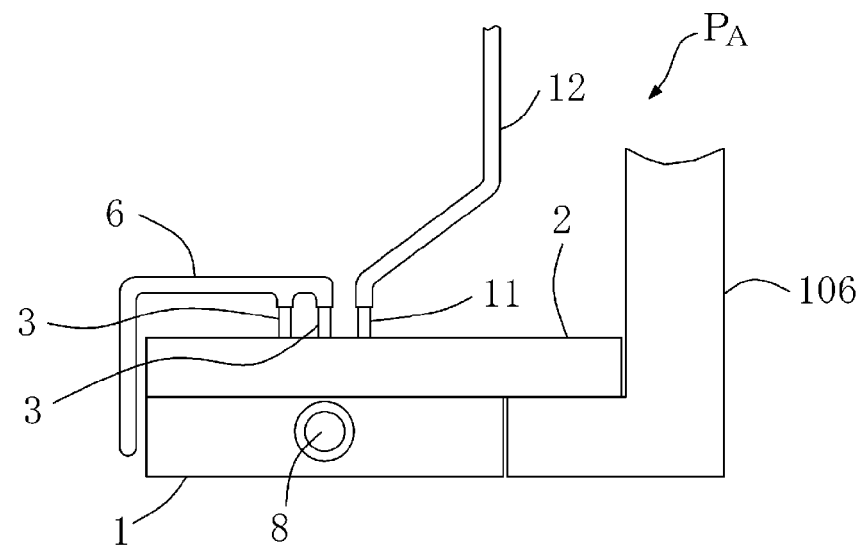
FIG. 13 is a side view of the probe assembly as shown in FIG. 10.

FIG. 13 is a side view of the probe assembly for front side electrodes of this example as shown in FIG. 10. In FIG. 13, the reference numeral 12 indicates a connecting cable. The gate probe 11 is connected to the tester 108 by the connecting cable 12. Further, as shown in FIG. 13, the probe assembly for front side electrodes P$_A$ is attached to the manipulator 106 through the block cover 2.

Figure 14:
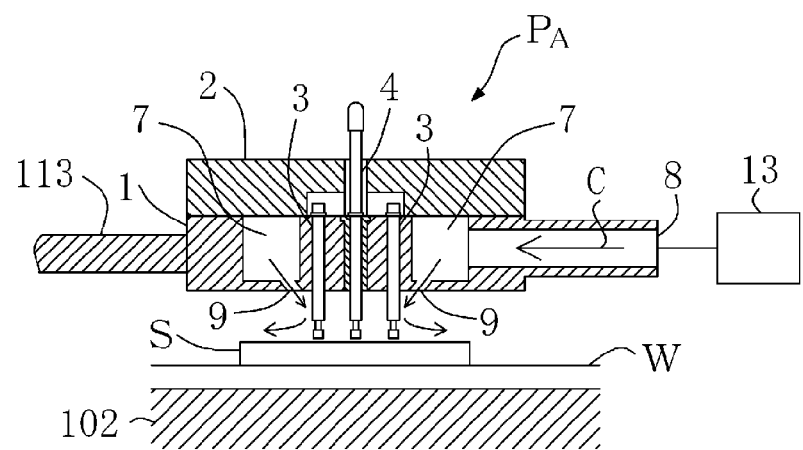
FIG. 14 is a partial cross section showing the probe assembly in operation.

FIG. 14 is a partial cross section of the probe assembly for front side electrode P$_A$ as shown in FIG. 10, which is in operation. In FIG. 14, the reference numeral 13 indicates a cooling medium supply system. Cooling medium C supplied from the cooling medium supply system 13 to the cooling medium entrance 8 fills the cooling chamber 7, and cools the force probes 3, the sense probes 4, and the gate probe 11 through the probe block 1. The cooling medium C then goes out from the cooling medium exits 9 to come into contact with the semiconductor device S formed on the wafer W located below and cools the semiconductor device S.

In the example, since the cooling medium exits 9 open not straight downward, but diagonally downward toward the protruding end parts of the force probes 3, the sense probes 4 and the gate probe 11, the cooling medium C, which goes out from the cooling medium exits 9, first comes into contact with the end parts of the probes and then, after having cooled the end parts, comes into contact with the semiconductor S. Accordingly, the forces probes 3, the sense probes 4 and the gate probe 11 are well cooled, which is advantageous effects. The cooling medium exits 9 may open straight downward. In this case, the cooling medium C going out from the cooling medium exits 9 comes into contact with the semiconductor device S directly and cools the semiconductor device S. Furthermore, while the cooling chamber 7 is formed in the probe block 1 in this example, the location of the cooling chamber 7 is not limited to the inside of the probe block 1. The cooling chamber 7 can be located outside, or both inside and outside of the probe block 1, as long as the cooling medium introduced into the cooling chamber 7 is able to exchange the heat with the probe block 1.

Figure 15:
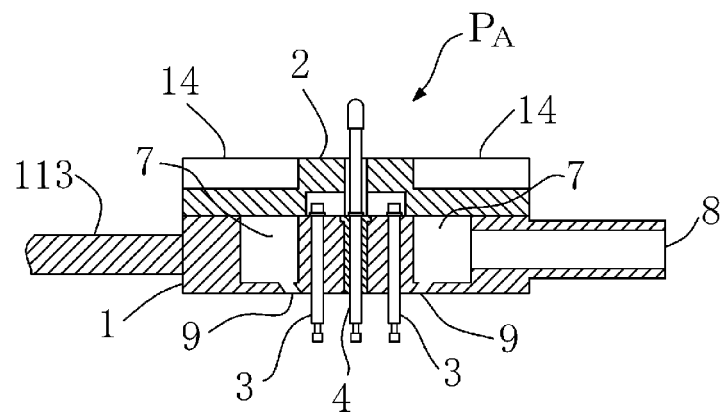
FIG. 15 is an enlarged partial cross section showing another example of the probe assembly of the present invention.
Figure 16:
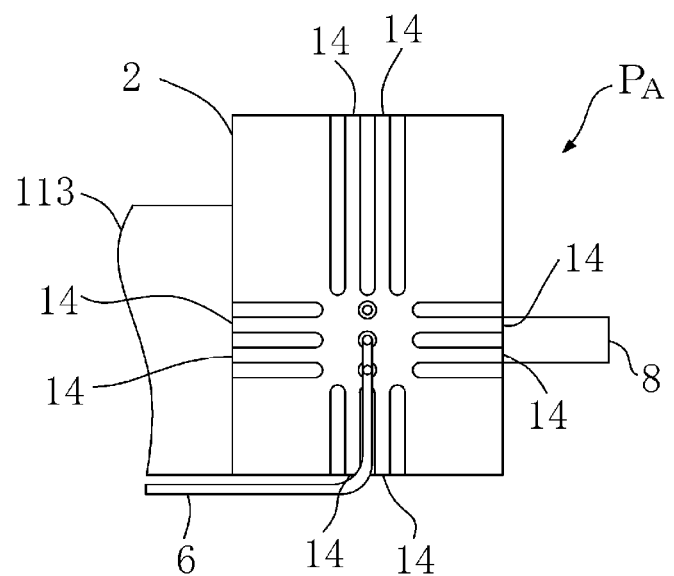
FIG. 16 is a plane view showing the probe assembly as shown in FIG. 15.
Figure 17:
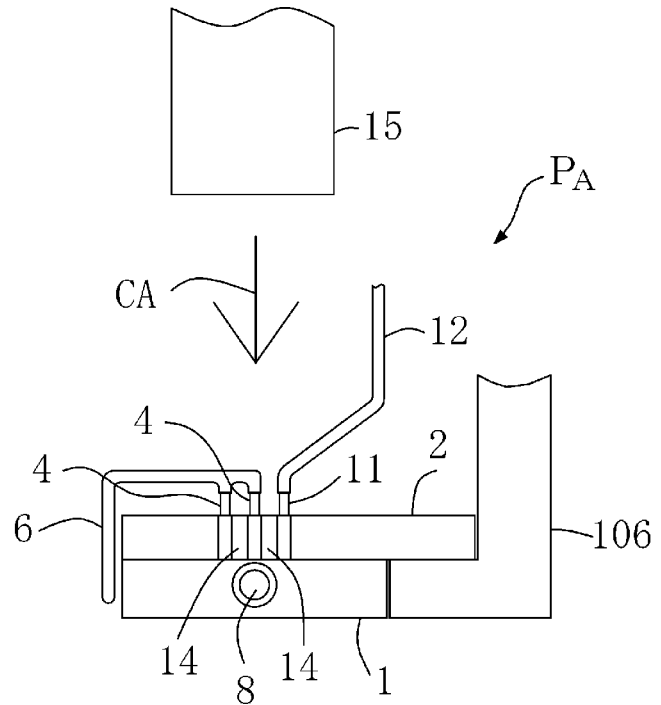
FIG. 17 is a side view showing the probe assembly as shown in FIG. 15.

FIGS. 15, 16 and 17 are an enlarged partial cross section, a plane view and a side view, respectively, showing another example of the probe assembly for front side electrodes $P_A$, which is a probe assembly of the present invention. The probe assembly for front electrodes $P_A$ of this example equips cooling fins 14 on the upper surface of the block cover 2 in addition to the cooling means comprising the cooling chamber 7, the cooling medium entrance 8 and the cooling medium exits 9. The cooling fins 14 of this example are formed by removing a part of the block cover 2 to produce the grooves. Accordingly, the upper surfaces of the cooling fins 14 are even with the upper surface of the block cover 2. The cooling fins 14 can be formed by standing plate like components on the upper surface of the block cover 2.

In operation, a cooing gas nozzle 15 is positioned over the probe assembly for front electrodes $P_A$ as shown in FIG. 17. Then, a blower, not illustrated, connected to the cooling gas nozzle 15 is activated to jet out the cooling gas CA from the cooling gas nozzle 15 toward the probe assembly for front side electrodes $P_A$. The cooling gas CA thus jetted out comes into contact with the connecting cables 6 and 12, and the upper surface of the block cover 2 and cools them. As the cooling fins 14 are provided on the block cover 2, the contact area of the cooling gas CA and the block cover 2 increases as compared with the case without the cooling fins 14. Accordingly, the heat exchange between the cooling gas CA and the block cover 2 is promoted and the various probes contained in the probe block 1 are cooled efficiently. As a matter of course, not only the block cover 2 but also the probe block 1 may equip cooling fins.

In parallel with the cooling of the probes through the probe block 1 and the block cover 2 with the cooling gas CA jetted out from the cooling gas nozzle 15, the cooling medium supply system above mentioned may be activated to supply the cooling medium C into the cooling chamber 7 passing through the cooling medium entrance 8, thereby the probes contained in the probe block 1 are cooled by both cooling means at the same time. The probe block 1 and the probes contained therein can be cooled with the cooling gas CA only, which jets out from the cooling gas nozzle 15. Furthermore, the cooling fins 14 are dispensable if the probe block 1 and the probes contained therein are sufficiently cooled without them. Since the cooling gas CA is jetted out downward from the cooling gas nozzle 15 in this example, the cooling gas CA first exchanges its heat with the probe block 1 and the block cover 2 to cool the probes, and then comes into contact with the semiconductor device located below and cool the semiconductor device.

Figure 18:
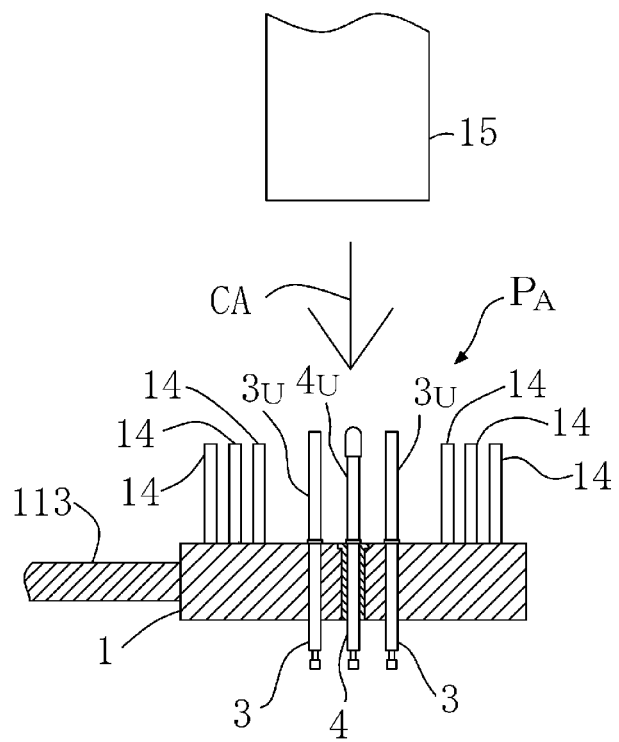
FIG. 18 is an enlarged partial cross section showing further another example of the probe assembly of the present invention.

FIG. 18 is an enlarged partial cross section of another example of the probe assembly for front side electrodes $P_A$, which is a probe assembly of the present invention. In the probe assembly for front side electrodes $P_A$ as shown in FIG. 18, no block cover 2 is provided. The upper ends $3_U$ of the force probes 3, the upper ends $4_U$ of the sense probes 4, and the upper end of the gate probe 11, which does not appear in FIG. 18, are all protrude upward from the probe block 1 and the protruding upper ends of the probes function as cooling fins. When a blower, not illustrated, is operated to jet out the cooling gas CA from the cooling gas nozzle 15 toward the probe assembly for front side electrodes $P_A$ as shown by arrow in the figure, the cooling gas comes into contact with the upper ends $3_U$ of the force probes 3, the upper ends $4_U$ of the sense probes 4, and further the upper end of the gate probe 11, not appeared in the figure, to exchange the heat and cool the probes directly. After having come into contact with the upper ends of the probes, the cooling gas further comes into contact with the probe block 1 to cool the various probes contained in the probe block 1 as well as the probe block 1. Apart from the upper ends of the various probes, cooling fins 14 in plate form may be stood on the upper surface of the probe block 1. When the cooling fins 14 are provided, the various probes can be cooled more efficiently through the probe block 1.

Figure 19:
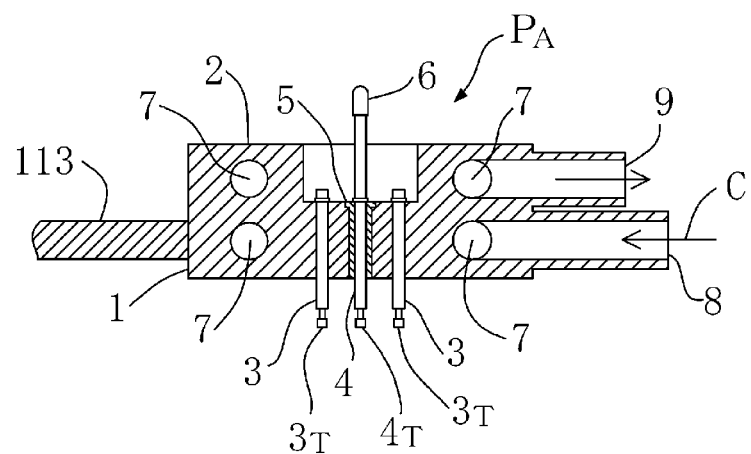
FIG. 19 is an enlarged partial cross section showing further another example of the probe assembly of the present invention.

FIG. 19 is an enlarged partial cross section showing further another example of the probe assembly for front side electrodes $P_A$, which is a probe assembly of the present invention. In the example as shown in FIG. 19, the cooling medium C supplied from a cooling medium supply system, not illustrated, is introduced into the cooling chamber 7 formed in the probe block 1 through the cooling medium entrance 8, and, after having flowed inside of the continued cooling chamber 7, discharged from the cooling medium exit 9 to back to the original cooling medium supply system. As mentioned above, in the probe assembly for front side electrodes $P_A$ of this example, the cooling medium C flows inside of the cooling chamber 7, which is continuously formed within the probe block 1, and exchange the heat with the probe block 1 to cool the various probes contained in the probe block 1. Since the cooling medium C does not touch the probes contained in the probe assembly for front side electrode $P_A$ in this example, an appropriate liquid, such as water, can be employed as a cooling medium C.

Figure 20:
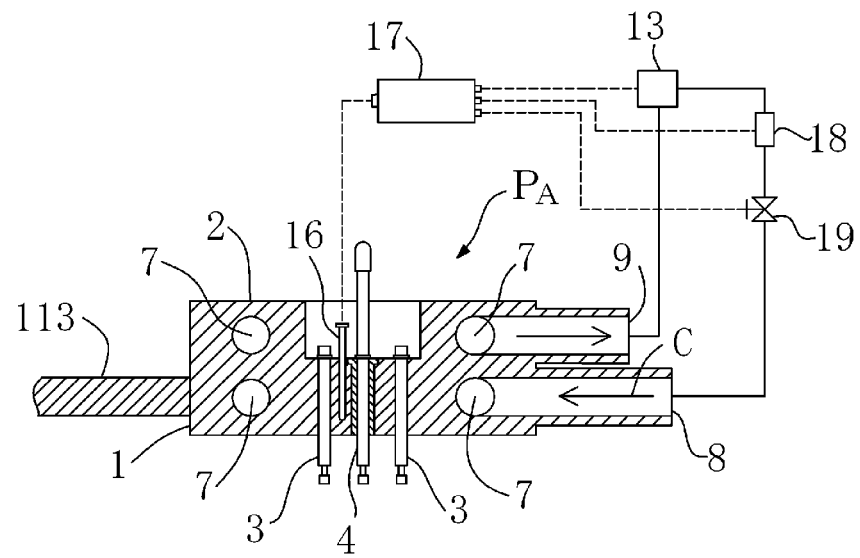
FIG. 20 is a schematic drawing showing further another example of the probe assembly of the present invention.

FIG. 20 is a schematic view showing further another example of the probe assembly for front side electrodes $P_A$, which is a probe assembly of the present invention. In FIG. 20, the reference numeral 16 indicates temperature sensor, which is attached at an appropriate position of the probe block 1 to measure the temperature of the probe block 1. The reference numeral 17 indicates a control unit, the reference numeral 13 indicates a cooling medium supply system, the reference numeral 18 indicates a cooling medium cooling unit, and the reference numeral 19 indicates a flow controlling valve. The control unit 17 receives an output signal from the temperature sensor 16 and compares the output signal with the predetermined target temperature. When the difference between the output signal and the predetermined target temperature is larger than the prescribed magnitude, then the control unit 17 regulates any one of the cooling medium supply system 13, the cooling medium cooling unit 18 and the flow controlling valve 19, or two or more of them so that the temperature of the probe block 1, namely the temperature of the various probes contained in the probe block 1 is maintained at the target temperature. When the probe assembly of the present invention equips the temperature sensor and the control unit as mentioned above, it is possible not only to know the temperature of the probes contained in the probe block 1, but also to maintain the temperature of the probes at the predetermined target temperature automatically, which contributes to more accurate characteristics inspection.

Peltier elements, for example, can be used as a cooling means instead of the cooling means as mentioned above, or in combination with either one or more cooling means as mentioned above.

While the probe assembly for front side electrodes $P_A$ is explained as an example of the probe assembly of the present invention, as a matter of course, the probe assembly of the present invention can be used as a probe assembly for back side electrodes $P_B$. The structure of the probe assembly for back side electrode $P_B$ according to the present invention is basically same as that of the probe assembly for front side electrode $P_A$ except that the probe assembly for back side electrodes $P_B$ lacks the gate probe 11 and has the force probes 3 and the sense probes 4 slightly different from those in the probe assembly for front side electrodes $P_A$ in their size and configuration.

While the above explanation was made with respect to the inspections of power semiconductor devices in wafer state, the probe assembly of the present invention and the inspection apparatus having the probe assembly of the present invention are also useful for the inspection of power semiconductor devices diced out in chip state.

INDUSTRIAL APPLICABILITY

As explained above, according to the probe assembly for inspecting power semiconductor devices and the inspection apparatus using the same of the present invention, it is possible to conduct characteristics inspection of power semiconductor devices applying a large electric current in accordance with the conditions on their actual performance. Therefore, it is possible to eliminate the disadvantages that characteristics failure is found for the first time in a final full-spec inspection. The probe assembly for inspecting power semiconductor devices of the present invention and the inspection apparatus for power semiconductor devices equipped with the probe assembly of the present invention are both effective to prevent increase of the volume of waste and rise of the product cost caused by useless processes. The present invention possesses great industrial applicability.

What is claimed is:

1. A probe assembly for inspecting power semiconductor devices, which comprises;
    (1) a probe block having more than one probe holding hole,
    (2) more than one probe, each probe being contained in one of the probe holding holes with an outer surface of the probe being in contact with an inner surface of the probe holding hole, and having a lower end protruding from the probe block and coming into contact with one of the power semiconductor devices on inspection, and
    (3) one or more cooling means which cool the probe block,
    wherein the probe block has a cooling chamber inside and/or outside of the probe block, and the cooling chamber has a cooling medium entrance and a cooling medium exit, and
    wherein one of the cooling means is a cooling medium supply system which supplies cooling medium into the cooling chamber through the cooling medium entrance, and the cooling medium exit opens toward the lower ends of the probes protruding from the probe block.

2. The probe assembly for inspecting power semiconductor devices according to claim 1, wherein one of the cooling means is a blower which blows cooling gas to the probe block.

3. The probe assembly for inspecting power semiconductor devices according to claim 2, wherein the probe block has cooling fins.

4. The probe assembly for inspecting power semiconductor devices according to claim 2, wherein the upper ends of the probes protrude from the probe block and function as cooling fins.

5. The probe assembly for inspecting power semiconductor devices according to claim 1, wherein the cooling medium is gas.

6. The probe assembly for inspecting power semiconductor devices according to claim 1, further comprising a temperature sensor which measures the temperature of the probe block.

7. The probe assembly for inspecting power semiconductor devices according to claim 6, further comprising a control unit which regulates the action of the cooling means based on an output signal of the temperature sensor to control the temperature of the probe block.

8. The probe assembly for inspecting power semiconductor devices according to claim 1, wherein the probes comprise a force probe and the force probe electrically continues to the probe block by being in contact with the inner surface of the probe holding hole.

9. An inspection apparatus for power semiconductor devices, which comprises the probe assembly for power semiconductor devices according to claim 1.

* * * * *